(12) United States Patent
Maa et al.

(10) Patent No.: US 6,933,448 B2
(45) Date of Patent: Aug. 23, 2005

(54) PRINTED CIRCUIT BOARD HAVING PERMANENT SOLDER MASK

(75) Inventors: Chong-Ren Maa, Taipei (TW); Wan-Kuo Chih, Hsinchu (TW); Ming-Sung Tsai, Keelung (TW)

(73) Assignee: S & S Technology Corporation, Taoyuan (TW)

(*) Notice: Subject to any disclaimer, the term of this patent is extended or adjusted under 35 U.S.C. 154(b) by 0 days.

(21) Appl. No.: 10/758,426

(22) Filed: Jan. 16, 2004

(65) Prior Publication Data

US 2004/0149681 A1 Aug. 5, 2004

Related U.S. Application Data

(60) Division of application No. 10/153,852, filed on May 24, 2002, now Pat. No. 6,753,480, which is a continuation-in-part of application No. 09/974,908, filed on Oct. 21, 2001, now Pat. No. 6,395,625.

(30) Foreign Application Priority Data

May 24, 2002 (TW) ........................................ 91110994 A

(51) Int. Cl.$^7$ ................................................ H05K 1/03
(52) U.S. Cl. ...................... 174/255; 174/256; 361/795; 428/209
(58) Field of Search ................................. 361/792–795; 174/255–256, 260–266; 29/847–852; 428/209–210; 216/16–18

(56) References Cited

U.S. PATENT DOCUMENTS

| | | | |
|---|---|---|---|
| 3,620,933 A | 11/1971 | Grundald | |
| 3,874,440 A | 4/1975 | Voisin | |
| 4,211,603 A | 7/1980 | Reed | |
| 4,490,457 A | 12/1984 | Kardashian et al. | |
| 4,720,324 A | 1/1988 | Hayward | |
| 4,854,040 A | 8/1989 | Turek | |
| 5,047,114 A | 9/1991 | Frisch et al. | |
| 5,065,227 A | 11/1991 | Frankeny et al. | |
| 5,218,761 A | * 6/1993 | Maniwa et al. | ............... 29/852 |
| 5,316,787 A | 5/1994 | Frankeny et al. | |
| 5,576,135 A | 11/1996 | Nishikawa | |
| 5,626,774 A | 5/1997 | Paulus | |
| 5,665,525 A | 9/1997 | Pienemaa | |
| 5,699,613 A | 12/1997 | Chong et al. | |
| 5,840,402 A | * 11/1998 | Roberts et al. | ............. 428/131 |
| 5,861,076 A | 1/1999 | Adlem et al. | |
| 6,291,081 B1 | 9/2001 | Kurabe et al. | |
| 2001/0042637 A1 | 11/2001 | Hirose et al. | |

* cited by examiner

*Primary Examiner*—Kamand Cuneo
*Assistant Examiner*—Tuan Dinh
(74) *Attorney, Agent, or Firm*—Browdy and Neimark, P.L.L.C.

(57) ABSTRACT

A printed circuit board having a permanent solder mask includes a substrate made of a glassfiber reinforced epoxy resin material. The top and bottom surfaces of the substrate are disposed thereon a conductive pattern respectively. An epoxy resin solder mask is coated on each surface of the substrate in such a way that the conductive pattern is divided into a sheltered portion covered by the solder mask and an unsheltered portion exposed outside. The solder mask also has an even and smooth outer surface with a micro-roughness ranging between 0.5 $\mu$m~10 $\mu$m and an optimum thickness ranging between 2 $\mu$m~200 $\mu$m.

8 Claims, 3 Drawing Sheets

PRINTED CIRCUIT BOARD HAVING PERMANENT SOLDER MASK

This is a divisional of co-pending parent application 10/153,852, filed May 24, 2002 now U.S. Pat. No. 6,753, 480, which co-pending parent application is a CIP of 09/974, 908, filed Oct. 21, 2001, now U.S. Pat. No. 6,395,625, granted May 28, 2002.

BACKGROUND OF THE INVENTION

1. Field of the Invention

This invention relates to printed circuit boards (PCB), and more particularly to a PCB having permanent solder mask.

2. Description of the Prior Art

The U.S. Pat. No. 5,626,774 discloses a method for forming a solder mask on the surface of a PCB, which introduces a new idea that the material of the solder mask can be an epoxy resin selected from those used in the PCB field since it will be generally compatible with the glass fiber reinforced epoxy substrates. However, the method does not teach what a proper solder mask an outstanding PCB must have. For example, the outer surface of the solder mask must smooth enough, if not, there will need a lot of underfills between the outer surface and the chip attached thereon. In addition, if the roughness of the outer surface of the solder mask is unappropriate, the solder mask and the encapsulation of the IC chip package cannot be firmly combined each other.

Moreover, the conductive pattern disposed on the surface of the prior art PCB often includes a plurality of exposed portions uncovered by the solder mask for electrically connecting with other electrical devices. The adjacent wiring of the exposed portions will be shorted frequently due to the ion migration therebetween.

Furthermore, the vias of the prior art PCB, which run through the PCB and are used to electrically connect the conductive patterns disposed respectively on the top and bottom surfaces of the PCB, are not filled with the solder mask, so during the baking process of the PCB, the air contained in the vias will induce internal stress between the solder mask and the PCB. Such internal stress often results in the bend of the PCB.

SUMMARY OF THE INVENTION

It is an object of the present invention to provide an improved PCB having a permanent solder mask that has an even and smooth outer surface.

Another object of the present invention is to provide an improved PCB including a permanent solder mask on which an outer surface with an optimum micro-roughness is formed.

A further object of the present invention is to provide an improved PCB on which a conductive pattern having a high-density wiring can be disposed.

These objects are achieved with a printed circuit board (PCB) having a permanent solder mask. According to one aspect of the present invention, the PCB includes a substrate made of a material including a first resin. At least a conductive pattern is disposed on one surface of the substrate. A second resin having a thermal expansion coefficient substantially identical to that of the first resin is coated on the surface having the conductive pattern such that a solder mask having a predetermined thickness and an even and smooth outer surface is formed. In the meantime, the conductive pattern is divided into a sheltered portion covered by the solder mask and an unsheltered portion exposed outside. The even and smooth outer surface of the substrate can be defined in such a way that the difference between the thickness of the highest position of the solder mask and that of the lowest position of the solder mask is equal to or less than 10 $\mu$m measuring with a length unit of 500 mm.

According to a second aspect of the present invention, a PCB having a permanent solder mask is provided. The PCB comprises a substrate made of a material including a first resin. At least a conductive pattern is disposed on one surface of the substrate. A second resin having a thermal expansion coefficient substantially identical to that of the first resin is coated on the surface having the conductive pattern in such a way that a solder mask having an outer surface with a micro-roughness ranging between 0.5 $\mu$m~10 $\mu$m is formed.

According to a third aspect of the present invention, a PCB having a permanent solder mask is provided. The PCB comprises a substrate made of a material including a first resin. At least a conductive pattern having a sheltered portion and an unsheltered portion disposed on one surface of the substrate. The unshelteed portion of the conductive pattern has a base and a tip. A solder mask made of a second resin having a thermal expansion coefficient substantially identical to that of the first resin is coated on the surface of the substrate in such a way that a first area having a predetermined thickness and an even and smooth outer surface and a second area having a thickness less than that of the first area are formed. The first area of the solder mask covers the sheltered portion of the conductive pattern. The second area surrounds the base of the unsheltered portion such that the tip of said unsheltered portion is exposed outside.

BRIEF DESCRIPTION OF THE DRAWINGS

These and other objects and advantages of the present invention will be more readily apparent from the following detailed description of the various aspects of the present invention taken in conjunction with the accompanying drawings in which:

Referring now to FIGS. 1 and 2, there depicts a first embodiment of a PCB 10 in accordance with the present invention. PCB 10 comprises a substrate 20 and two solder masks 40.

Figure 1:
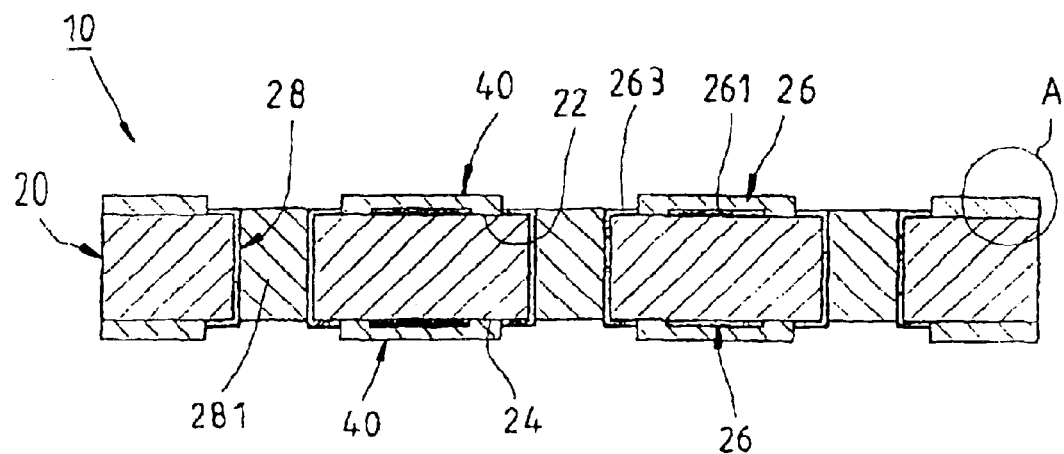
FIG. 1 is a cross-sectional view of a first embodiment of a PCB constructed in accordance with the present invention.

Substrate 20 is typically made of a glassfiber reinforced resin material. The resin can be epoxy resins polyamide resins or cyanoester resin. Substrate 20 has top surface 22 and bottom surface 24. Conductive patterns 26 having a sheltered portion 261 and an unsheltered portion 263 are disposed on the surfaces respectively. Conductive patterns 26 are electrically connected by way of a plurality of conductive vias 28 running through substrate 20.

Solder mask 40 is made of a resin having a thermal expansion coefficient substantially identical to that of the resin of substrate 20. In this embodiment, it is an epoxy resin. Solder masks 40 are coated on top and bottom surfaces of substrate 20 respectively in such a way that sheltered portion 261 is fully covered by solder mask 40 and unsheltered portion 263 is exposed outside. In the meantime, each Via 28 is filled by solder mask 40. Further speaking, each via 28 is filled by an interfill made of a material identical to that of solder mask 40.

For having a better understanding, the method to form solder mask 40 on surfaces of substrate 20 will be detailedly described below.

Figure 2:
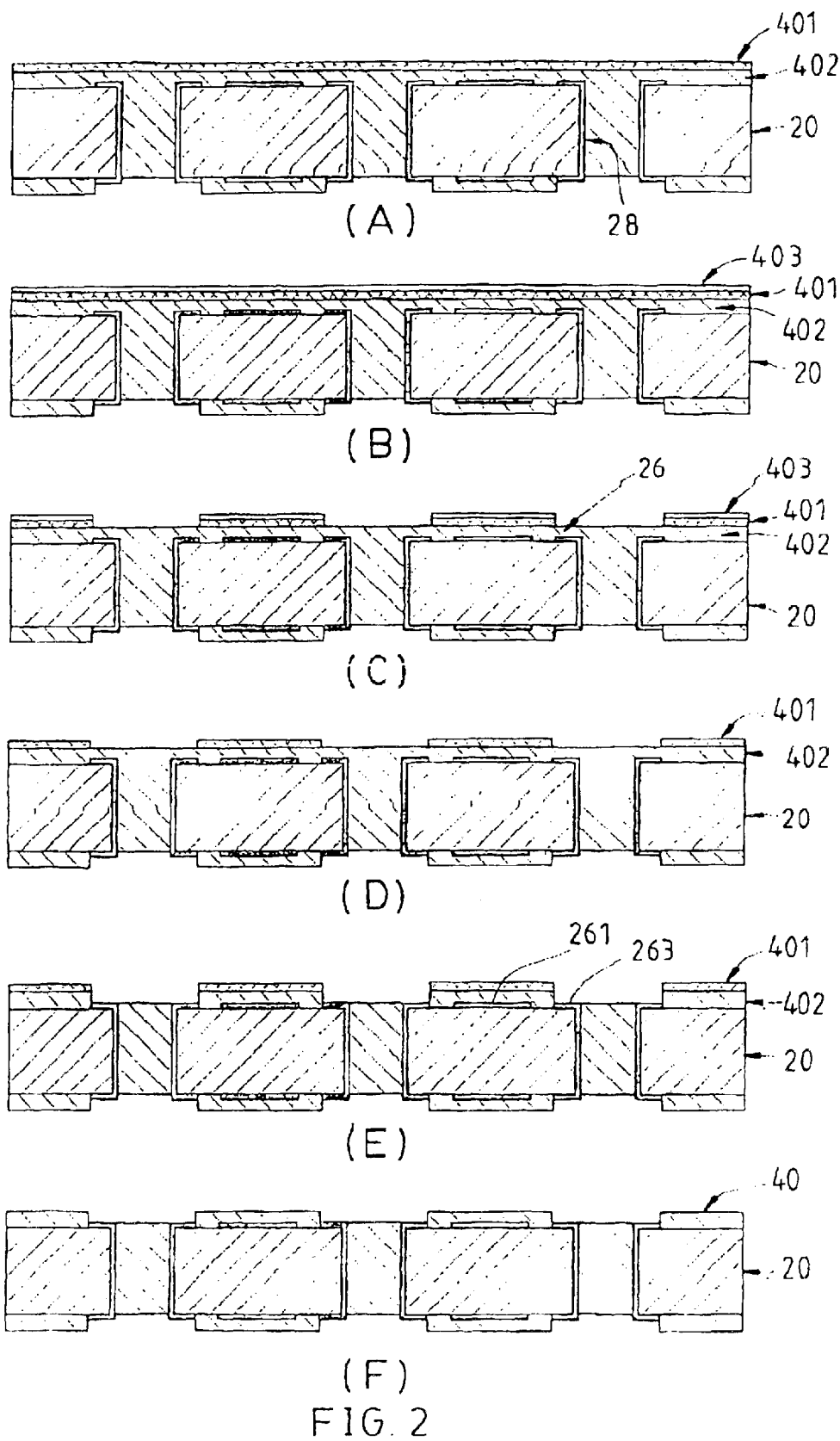
FIG. 2 illustrates the steps for forming a solder mask on a substrate according to the present invention.

Firstly, as shown in FIG. 2A, a metal foil 401, such as a copper or aluminum foil, coated with a layer 402 of a partially cured (B-staged) epoxy resin to one side thereof is prepared to apply onto the surfaces of substrate 20 having conductive patterns 26 disposed thereon such that layer 402 is sandwiched between metal foil 401 and substrate 20. Thereafter, metal foil 401 with layer 402 and substrate 20 are laminated with a pressure of 10~40 kgw/cm$^2$ and a temperature of 140~185 for 1.5 hours to 3 hours. As a result, a cured epoxy resin layer 402 is securely coated onto the surfaces of the substrate 20, and each via 28, in the meantime, is filled with a cured epoxy resin interfill.

Secondly, the surface of metal foil 401 is coated with a photo-resist layer 403 (as shown in FIG. 2B). Photo-resist layer 403 is then photocured using a mask which allows only the portions to be exposed to remain uncured, and then the uncured portions of the photo-resist layer and the metal foil thereunder are removed with suitable solvents to expose underlying epoxy resin layer 402 (as shown in FIG. 2C).

Subsequently, the residual (cured) portions of the photo-resist layer are removed with suitable solvents (as shown in FIG. 2D), and then underlying epoxy resin 402 is removed by a plasma etching method to expose unsheltered portions 263 of conductive pattern 26 (as shown in FIG. 2E).

Lastly, an etching method is applied to remove the residual metal foil 401 to leave the fully cured epoxy resin layer 402 thereunder as the solder mask 40 (as shown in FIG. 2F)

Figure 3:
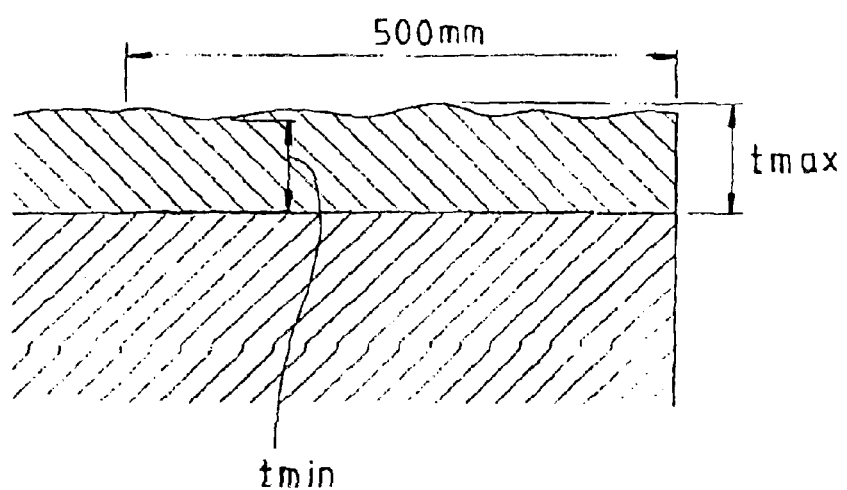
FIG. 3 is an enlarged view of A portion of FIG. 1.

It has been discovered that the solder mask made by the method mentioned above can be evenly disposed on the surfaces of the substrate to form an smooth outer surface and the average thickness of the solder mask can be controlled between 2 μm~200 μm. As shown in FIG. 3, the smooth outer surface can be defined in such a way that the difference between the thickness $t_{max}$ of the highest position of the solder mask and the thickness $t_{min}$ of the lowest position of the solder mask is equal to or less than 10 μm measuring with a length unit of 500 mm. It has also been found that the micro-roughness of the outer surface of the solder mask can be controlled between 0.5 μm~10 μm.

Figure 4:
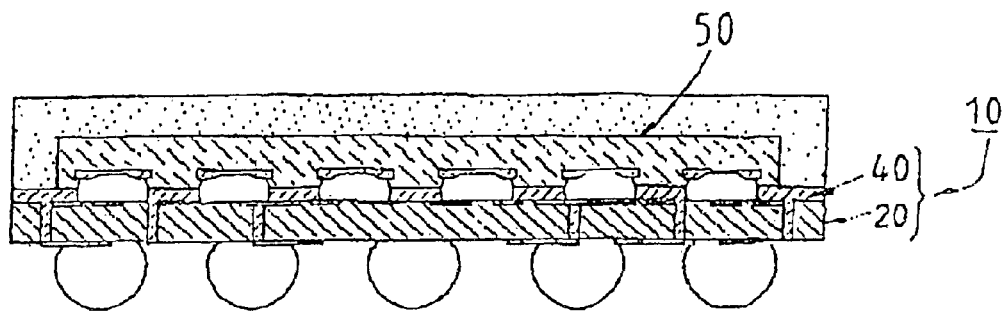
FIG. 4 is a cross-sectional view of a flip chip package including a second embodiment of a PCB constructed in accordance with the present invention.

Thereby, as shown in FIG. 4, when constructing a flip chip package, the PCB having a thick solder mask in accordance with the present invention can be used to have the chip 50 directly attaching to the substrate 20 thereof. In other words, the prior art underfilling process to fill the gap between the chip and the substrate is eliminated. Thus, the producing cost of the IC chip package will substantially be reduced and a thinnest IC chip package can be got.

Figure 5:
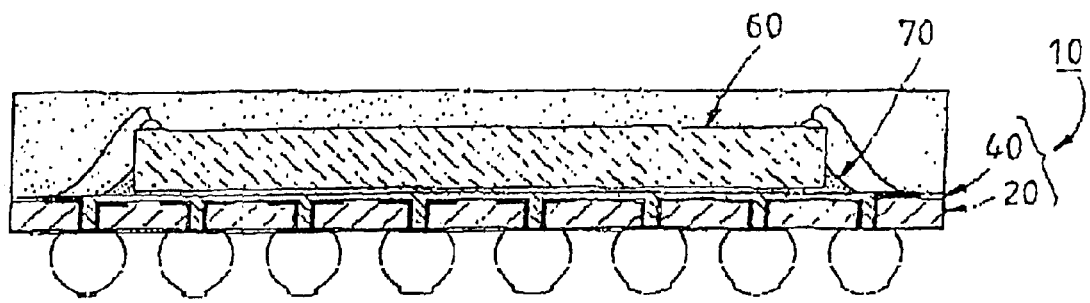
FIG. 5 is a cross-sectional view of a wire-bonded chip on board package including a third embodiment of a PCB constructed in accordance with the present invention.

As further shown in FIG. 5, when constructing a wire-bonded chip on board package, the PCB having a thin solder mask in accordance with the present invention can be provided to have the chip 60 directly attaching to the substrate 20 thereof with an extremely thin layer of epoxy adhesive 70. Thus, the reliability of the package will be enhanced. The thickness and the producing cost of the whole package will be significantly reduced.

Specifically, the vias of the substrate of the PCB constructed in accordance with the present invention as mentioned above are filled with interfills so that the internal stress between the solder mask and the PCB can be substantially decreased.

Figure 6:
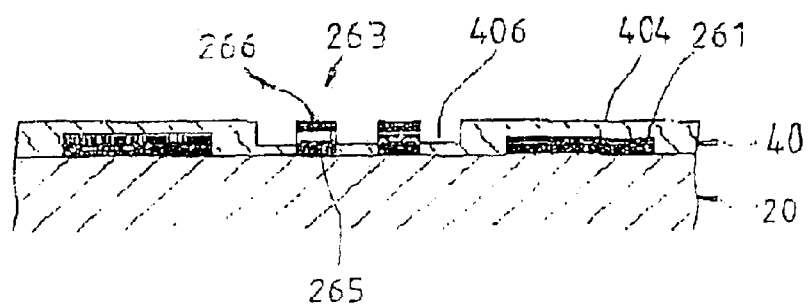
FIG. 6 is a partial, cross-sectional view of a fourth embodiment of a PCB in accordance with the present invention wherein the solder mask is formed with a first area covering the sheltered portion of the conductive pattern and a second area surrounding the base of the unsheltered portion of the conductive pattern.

Besides, referring to FIG. 6, in a preferred embodiment of a PCB in accordance with the present invention, the solder mask 40 has a first area 404 and a second area 406. Unsheltered portion 263 of conductive pattern 26 can be formed with a base 265 and a tip 266. Area 404 is used to fully cover sheltered portion 261 of conductive pattern 26. Area 406 is used to surround base 265 of the unsheltered portion such that tip 266 of the unsheltered portion is exposed outside. Thereby, the cohere strength of unsheltered portion 263 and substrate 20 will be enhanced. The ion migration of the wiring of unsheltered portion 263 will be reduced. In other words, the wiring-density of unsheltered portion 263 will be increased since the pitch between the wiring of unsheltered portion is reduced.

What is claimed is:

1. A printed circuit board having a permanent solder mask comprising:

a substrate made of a material including a first resin, said substrate having top and bottom surfaces, a first conductive pattern disposed on said top surface and having an unsheltered portion and a sheltered portion, said unsheltered portion having a base and a tip; and a first solder mask made of a second resin having a thermal expansion coefficient substantially identical to the thermal expansion coefficient of said first resin of said substrate, said first solder mask coated on said top surface to form thereon a layer having a first area and a second area, said first area having a first thickness, a smooth outer surface, and covering said sheltered portion, said second area having a second thickness less than that of said first area and surrounding said base of said unsheltered portion such that said tip of said unsheltered portion is exposed outside.

2. The printed circuit board of claim 1, wherein the difference between the thickness of the highest position of said first area of said first solder mask and the thickness of the lowest position of said first area of said first solder mask is equal to or less than 10 μm measuring with a length unit of 500 mm.

3. The printed circuit board of claim 1, wherein said bottom surface of said substrate is disposed a second conductive pattern having an unsheltered portion and a sheltered portion.

4. The printed circuit board of claim 1, wherein said first area of said solder mask has an average thickness between 2 μm~200 μm.

5. The printed circuit board of claim 1, wherein said outer surface of said first area has a micro roughness between 0.5 μm~10 μm.

6. The printed circuit board of claim 3, wherein a second solder mask made of said second resin is coated on said bottom surface to form thereon a layer having a first and second areas, said first area having a first thickness, a smooth outer surface, and covering said sheltered portion, said second area having a second thickness less than the first thickness and surrounding said base of said unsheltered portion such that said tip of said unsheltered portion is exposed outside.

7. The printed circuit board of claim 3 or 6, wherein said substrate further comprises a plurality of conductive vias therethrough by which said conductive patterns are electrically connected each other.

8. The printed circuit board of claim 7, wherein said conductive via has an interfill made of a material identical to the material of said solder mask.

* * * * *